US012130591B2

(12) United States Patent
Boccard et al.

(10) Patent No.: US 12,130,591 B2
(45) Date of Patent: Oct. 29, 2024

(54) PROCESS FOR MANUFACTURING A TIMEPIECE COMPONENT

(71) Applicant: ROLEX SA, Geneva (CH)

(72) Inventors: Cyriaque Boccard, Douvaine (FR); Jérôme Bouchet, Cologny (CH); Pierre Di Luna, Veigy-Foncenex (FR)

(73) Assignee: ROLEX SA, Geneva (CH)

( * ) Notice: Subject to any disclaimer, the term of this patent is extended or adjusted under 35 U.S.C. 154(b) by 608 days.

(21) Appl. No.: 17/221,518

(22) Filed: Apr. 2, 2021

(65) Prior Publication Data

US 2021/0311436 A1 Oct. 7, 2021

(30) Foreign Application Priority Data

Apr. 6, 2020 (EP) .................................... 20168211

(51) Int. Cl.
*G04B 45/00* (2006.01)
*A44C 27/00* (2006.01)
*G04D 3/00* (2006.01)

(52) U.S. Cl.
CPC ........ *G04B 45/0015* (2013.01); *A44C 27/007* (2013.01); *G04D 3/0074* (2013.01)

(58) Field of Classification Search
CPC . G04B 45/0015; A44C 27/007; G04D 3/0074
See application file for complete search history.

(56) References Cited

U.S. PATENT DOCUMENTS

| 4,583,866 A * | 4/1986 | Kasai ..................... G04B 19/12 968/156 |
| 4,684,264 A * | 8/1987 | Paperno ............... G04B 37/005 368/286 |
| 5,225,382 A * | 7/1993 | Mizuno ............... C23C 14/0015 501/134 |
| 10,295,961 B2 | 5/2019 | Oliveira |
| 2005/0210917 A1* | 9/2005 | Wiseman ............. A44C 27/006 63/4 |
| 2011/0236654 A1* | 9/2011 | Hsu ....................... A44C 27/007 428/210 |

(Continued)

FOREIGN PATENT DOCUMENTS

CN 108239747 A 7/2018
DE 29820230 U1 3/1999

(Continued)

OTHER PUBLICATIONS

European Search Report and Written Opinion dated Sep. 22, 2020 in counterpart application No. EP20168211; with English machine translation (total 16 pages).

(Continued)

*Primary Examiner* — Jack W Lavinder
(74) *Attorney, Agent, or Firm* — Seckel IP, PLLC

(57) ABSTRACT

A timepiece or jewelry component comprising a substrate and at least one decoration joined to the substrate, wherein it comprises a transparent coating covering at least one part of the substrate and at least one part of the decoration, the coating changing the perceptible color of the substrate without changing the perceptible color of the at least one decoration.

20 Claims, 4 Drawing Sheets
(2 of 4 Drawing Sheet(s) Filed in Color)

(56) References Cited

U.S. PATENT DOCUMENTS

| | | | |
|---|---|---|---|
| 2012/0304692 A1* | 12/2012 | Derrig | A44C 27/006 63/3 |
| 2016/0266551 A1* | 9/2016 | Oliveira | G04B 45/0076 |
| 2018/0181071 A1 | 6/2018 | Spassov | |
| 2018/0343993 A1* | 12/2018 | Derrig | A44C 27/006 |
| 2019/0008242 A1 | 1/2019 | Gapp et al. | |
| 2019/0078209 A1* | 3/2019 | Boccard | C23C 16/405 |
| 2019/0271951 A1* | 9/2019 | Bonke | G04B 47/042 |
| 2019/0338425 A1 | 11/2019 | McGill et al. | |
| 2019/0391535 A1 | 12/2019 | Berner et al. | |
| 2020/0221833 A1* | 7/2020 | Dousset | A44C 27/008 |
| 2021/0063968 A1* | 3/2021 | Furusato | G04B 45/0015 |
| 2021/0222297 A1 | 7/2021 | Boccard et al. | |
| 2021/0311436 A1* | 10/2021 | Boccard | G04B 19/12 |
| 2021/0403725 A1* | 12/2021 | Dousset | A44C 27/007 |
| 2022/0299689 A1* | 9/2022 | Barbos | C23C 14/14 |
| 2023/0002882 A1* | 1/2023 | Vuille | G04B 31/08 |
| 2023/0008589 A1* | 1/2023 | Yoshinaga | B23K 26/40 |
| 2023/0315018 A1* | 10/2023 | Fuji | G04D 3/0069 368/232 |

FOREIGN PATENT DOCUMENTS

| | | |
|---|---|---|
| EP | 3588203 A1 | 1/2020 |
| JP | 2006208207 A | 8/2006 |
| JP | 2008122162 A | 5/2008 |
| JP | 2012159380 A | 8/2012 |
| JP | 2016173361 A | 9/2016 |
| JP | 2019503224 A | 2/2019 |
| JP | 2019053045 A | 4/2019 |
| JP | 2019059974 A | 4/2019 |

OTHER PUBLICATIONS

JP Office Action dated Sep. 3, 2024 in counterpart application No. JP 2021-063911; with English machine translation (total 9 pages).

* cited by examiner

Figure 1

PROCESS FOR MANUFACTURING A TIMEPIECE COMPONENT

This application claims priority of European patent application No. EP20168211.9 filed Apr. 6, 2020, the content of which is hereby incorporated by reference herein in its entirety.

BACKGROUND ART

The present invention relates to a process for manufacturing a timepiece or jewelry component comprising a substrate and at least one decoration. It also relates to a timepiece or jewelry component as such obtained by such a process.

It is common in the manufacture of timepieces or jewelry to form a component by means of a substrate to which a decoration is joined. For example, such a component can be a watch applique, in the form of a solid gold substrate on which diamonds or gemstones are set.

It is advantageous to be able to diversify these timepiece or jewelry components, in particular by changing their appearance, particularly the color of the substrate, to offer several aesthetic appearance possibilities.

A first solution of the state of the art consists in providing various substrates, for example by using different alloys. Such a solution has the disadvantage of high cost, since several different alloys must be manufactured, stored and handled. Moreover, the development of a new alloy is a long and difficult process, and only certain colors are accessible.

Another solution of the state of the art consists in changing the appearance of a substrate by a coating. Such a solution simplifies the previous solution, since the same base substrate can be used to form several substrates of different appearances. However, such a solution presents a risk of damaging the coating deposited on the substrate during the subsequent steps, in particular during the attachment of the decorations, for example at the level of the claws of a crimped setting. Any imperfection of the substrate, even at the level of the attachment of the decorations, is to be avoided. It is therefore tricky with such a solution to guarantee with reliability and robustness the quality of the aesthetic appearance obtained.

In addition, it should be taken into account that, in all cases, it is desirable to be able to join all kinds of decorations to a substrate to form a timepiece and jewelry component, in order to be able to offer a multitude of different results. In other words, the manufacturing solution should advantageously be compatible with the joining of a large number of decorations of different types. Naturally, it is also necessary to guarantee that none of these decorations will be damaged during the manufacturing process, in order to keep the aesthetic appearance intact, for which it was chosen.

SUMMARY OF THE INVENTION

Thus, the object of the present invention is to improve the known processes for manufacturing a timepiece or jewelry component comprising a substrate to which at least one decoration is joined.

More precisely, the object of the invention is to be able to manufacture a timepiece or jewelry component with an attractive aesthetic appearance, by virtue of the assembly of a decoration on a substrate, allowing great flexibility in the choice of materials that can be used and the aesthetic results that can be obtained, particularly the colors that the substrate can take, and guaranteeing a perfection of the aesthetic appearance obtained.

To this end, the invention is based on a timepiece or jewelry component comprising a substrate and at least one decoration joined to the substrate, wherein it comprises a transparent coating covering at least one part of the substrate and at least one part of the decoration, the coating changing the perceptible color of the substrate without changing the perceptible color of the at least one decoration.

The invention also relates to a timepiece or jewelry piece comprising such a timepiece or jewelry component.

The invention also relates to a process for manufacturing a timepiece or jewelry component, comprising the following steps:

Obtaining a substrate;
Joining at least one decoration to said substrate to form a component; and wherein it comprises a subsequent step consisting in depositing a transparent coating on at least one part of the substrate and on at least one part of the decoration, so that the coating changes the perceptible color of the substrate without changing the perceptible color of the at least one decoration.

The invention is more particularly defined by the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These objects, features and advantages of the present invention will be set forth in detail in the following description of particular embodiments made in a non-limiting manner in relation to the appended figures among which:

FIG. 1 represents components obtained for different coating thicknesses according to a first example embodiment of the invention.

DETAILED DESCRIPTION OF PARTICULAR EMBODIMENTS

Figure 2:
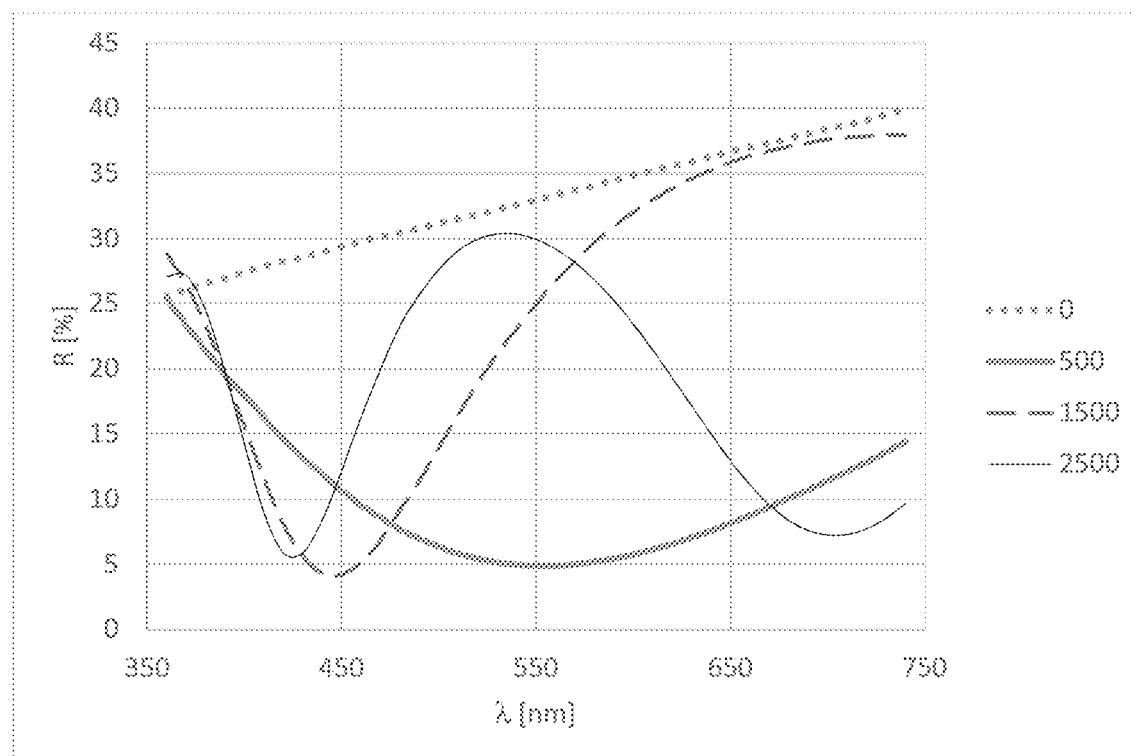
FIGS. 2 through 4 represent reflectances (R in %) as a function of wavelength (A in nm) measured on a white gold, yellow gold and pink gold substrate, respectively, according to a second example embodiment of the invention.

The invention achieves the desired object in a simple and surprising way, by means of depositing the same coating both on the substrate and on the decoration(s) of a timepiece or jewelry component, this coating being designed to change the appearance of the substrate without changing the appearance of the decoration(s). The invention thus makes it possible to obtain a substrate whose color can be chosen from a wide choice of possibilities, by means of the combination of the substrate material and the characteristics of the coating. It also allows any damage to the coating to be avoided and a final appearance to be obtained, particularly the perceptible color, without imperfections, since no complex subsequent operation is necessary on the substrate, due to the fact that the decorations are attached to the substrate before the deposition of the coating. Finally, the process is very simple to implement since there is no need to mask the decoration(s) before the deposition of the coating. The latter can simply be deposited on the entire component.

As an additional remark, the process according to the invention is moreover compatible with any three-dimensional shape, even complex, of the decoration and/or the substrate. The coating advantageously covers the entire surface of the component, including that of the decoration(s), in addition to that of the substrate. The coating is chosen so as to have a negligible impact, if any, on the appearance of the decoration(s). Thus, the invention is based on the clever use of a single coating positioned on a component composed of at least two different parts made of two different materials, exploiting two different, even opposite, effects of said coating on each of the two materials of said two parts, respectively.

In other words, the invention relates to a process for manufacturing a timepiece or jewelry component, which comprises the following steps:
 Obtaining a substrate;
 Joining at least one decoration to said substrate to form a timepiece or jewelry component; and
 Depositing a coating on the entire component, or on at least one part of the substrate and on at least one decoration, the coating being designed to change the perceptible color of the substrate without changing the perceptible color of the decoration.

The invention will now be described in the context of several example embodiments.

According to a first example embodiment, the timepiece component is a timepiece dial applique. The applique comprises a white/grey gold substrate, with a sputtered surface, so that it is rough, set with decorations. The decorations are diamonds with a maximum visible diameter of 0.65 mm. The process of the invention is implemented by depositing a tantalum oxide coating, preferably stoichiometric $Ta_2O_5$, on the entire surface of the timepiece component.

According to this embodiment, the deposition step is carried out by the atomic layer deposition technique, known by its acronym ALD. This technique uses for example a gaseous precursor TBTEMTa (t-butylimido)tris(ethylmethylamino)tantalum(V), CAS No. 511292-99-2, at a deposition temperature of 150° C.

Several variant embodiments are implemented, respectively for several thicknesses of the tantalum oxide coating. The deposited thicknesses are comprised between 4.5 nm and 225.0 nm. The variants correspond to a succession of phases of 50 deposition cycles and make it possible to produce thicknesses evenly distributed every 4.5 nm, in the above-mentioned range.

Figure 1:
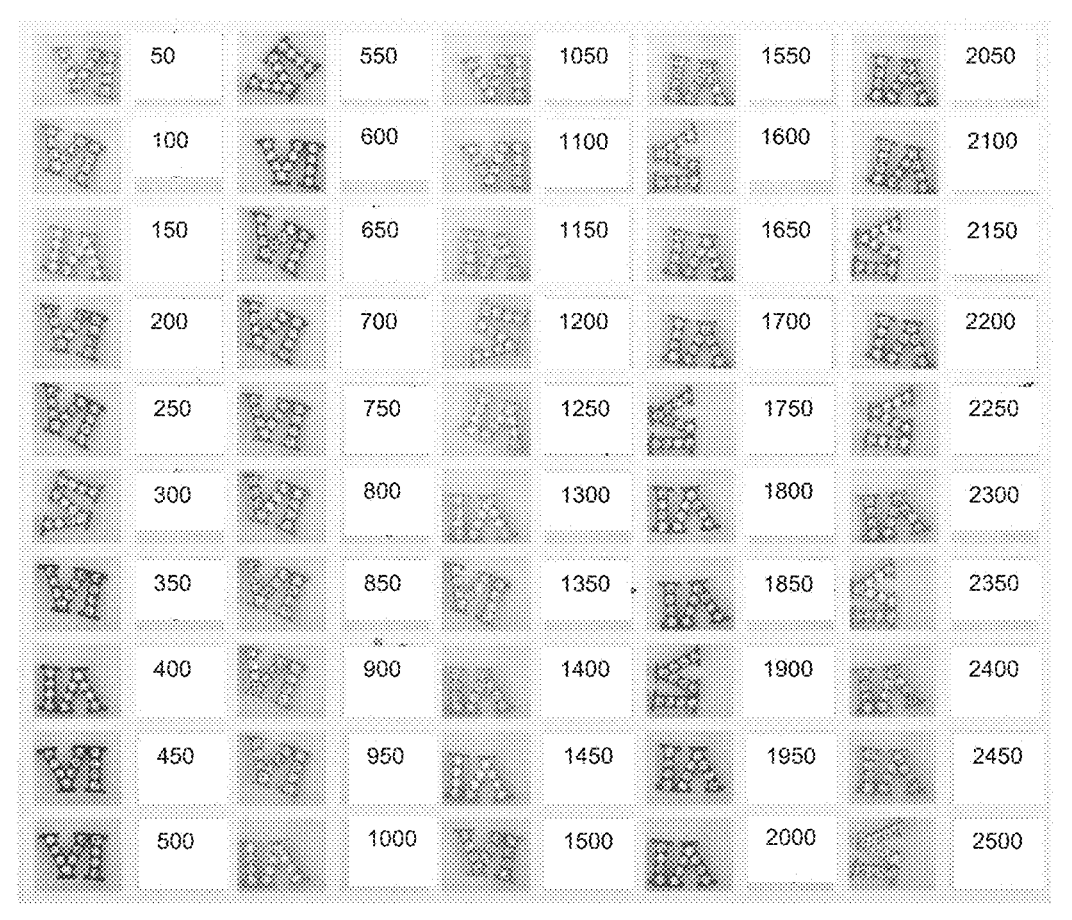

All these variants make it possible to achieve a coloring of the white gold of the substrate, according to a whole palette of colors which depends on the thickness of the coating, and thus on the number of deposition cycles, as represented by FIG. 1. Observation shows that this coloring is already slightly perceptible for a thickness of 4.5 nm (50 cycles), then clearly perceptible from a thickness of 9 nm (100 cycles) included.

Moreover, in all cases, the coating does not induce any perceptible change in the appearance of the diamonds, in particular no change in their color, nor in their brilliance or transparency.

To validate these results observed on the changes in color, spectrophotocolorimetric measurements are carried out in reflection on "control" plates of white gold identical to the gold of the appliques, colored according to the example embodiment of the invention. These control pieces were made to have a sufficient surface area for the measurement. They were produced in the same way as the substrates of the appliques (same material, same surface finish preparation, same coating). Reflectance measurements are made between 360 nm and 740 nm with the observer at 2° and the illuminant D65. The luminosity L* and the chromaticity values a and b* are evaluated in the space defined by the International Commission on Illumination, CIE L*a*b*, as indicated in the "Technical Report of Colorimetry" CIE 15: 2004. The measurements are made in specular component excluded (SCE) mode.

Color differences are defined by:

$$\Delta E^*_{Lab} = \{(\Delta L^*)2 + (\Delta a^*)2 + (\Delta b^*)^2\}^{1/2}$$

For the sake of simplicity, $\Delta E^*_{Lab}$ is denoted $\Delta E^*$ hereinbelow.

With:

$$\Delta L^* = L^*_1 - L^*_0$$

$$\Delta a^* = a^*_1 - a^*_0$$

$$\Delta b^* = b^*_1 - b^*_0$$

where the subscripts "1" and "0" denote two surfaces to be compared. In the present case, the subscript "0" is the surface of the substrate as it is before receiving the tantalum oxide coating and the subscript "1" corresponds to the same surface after having been coated with the tantalum oxide coating by the ALD technology, as explained above.

The thresholds above which color changes are considered perceptible are dependent on the initial color, the observation conditions, and the sensitivity of the perception. Generally, a color difference is considered perceptible from 1 (i.e. $\Delta E^* \geq 1$), for two surfaces observed while they are positioned next to each other. For surfaces observed consecutively, a difference of $\Delta E^* < 3$ or 4 may be difficult to perceive: the threshold can then be defined as a function of different criteria. In particular, for small appliques intended to be positioned under watch glasses, a difference in color is generally perceptible from $\Delta E^*$ greater than or equal to 4. In summary, the perception will in all cases be clear for $\Delta E^* \geq 4$, and even sometimes for $\Delta E^* \geq 3$, and non-existent for $\Delta E^* < 1$.

The results of the spectrocolorimetric measurements carried out on the controls simulating the substrate according to two variants of this first example embodiment are given in Table 1 below.

TABLE 1

Spectrocolorimetric measurements expressed in CIE L*a*b* space in SCE mode for several thicknesses of $Ta_2O_5$ coatings deposited on white gold alloy control parts with a rough (sputtered) surface finish.

| $Ta_2O_5$ coating thickness [nm] (cycles) | L*(D65) | a*(D65) | b*(D65) | $\Delta E^*$ |
|---|---|---|---|---|
| 0 (0) | 64.2 | 1.6 | 5.2 | 0 |
| 4.5 (50) | 63.3 | 2.0 | 7.0 | 2.0 |
| 9.0 (100) | 60.6 | 2.3 | 9.3 | 5.5 |

This table confirms that on the white gold alloy tested, coloring is clear ($\Delta E^* = 5.5$) beyond a 9 nm thickness of tantalum oxide coating, and that it is slightly perceptible for a thickness of 4.5 nm ($\Delta E^* = 2$). These measurements confirm the observations. This color difference may vary with increasing thickness of the coating, but remains perceptible, or at least slightly perceptible, over the entire range tested (4.5 to 225 nm respectively 50 to 2500 cycles).

According to a second example embodiment, a tantalum oxide coating is deposited by ALD technology on appliques comprising respectively a yellow, pink or white gold alloy substrate, with a sputtered finish, set with diamonds whose maximum visible diameter is 0.65 mm, without masking the diamonds during the deposition step.

This example illustrates a similar behavior, regardless of the composition of the gold alloy used to form the substrate: the color of the metal part forming the substrate of the set timepiece component varies as a function of the thickness of the coating layer deposited, without the appearance of the diamonds being affected.

It appears that for a metal substrate, which reflects all the incident light from its upper surface, the coloring effect is present as soon as a certain thickness of tantalum oxide is reached, this thickness being dependent on the chemical nature of the substrate and the intrinsic characteristics of the deposited layer (nature, stoichiometry, density, etc.).

As before, the yellow, pink and white gold alloy appliques, with a sputtered finish, set with diamonds, are coated with tantalum oxide with different thicknesses ranging from 4.5 nm (50 cycles) to 225 nm (2500 cycles). When observed, it is noted that they visually present:

A coloring of the gold alloys constituting the substrates according to a whole palette of colors, the coloring being clear from a coating thickness of 4.5 nm for the pink and yellow gold alloys, and from 9 nm for the white gold alloy;

The absence of perceptible coloring of the diamonds.

In addition, spectrophotocolorimetric measurements are carried out as for the first preceding example. The results of the spectrophotocolorimetric measurements performed on controls featuring the previously mentioned substrates is given in Table 2 below. These results indicate in particular that on the three sputtered gold alloys tested, the coloring is clear ($\Delta E^* \geq 5.5$) beyond a thickness of 9 nm of tantalum oxide coating, and is even already clear from a 4.5 nm thickness for the yellow and pink gold alloys ($\Delta E^* > 3.7$). The coloring is slightly perceptible on the white gold alloy ($\Delta E^* = 2$) for this 4.5 nm thickness. These measurements therefore confirm the visual observations summarized above.

TABLE 2

Spectrocolorimetric measurements expressed in CIE L*a*b* space in SCE mode for several thicknesses of $Ta_2O_5$ coatings deposited on different types of surfaces.

| Substrate: Gold alloy | $Ta_2O_5$ coating thickness [nm]. | L*(D65) | a*(D65) | b*(D65) | $\Delta E^*$ |
|---|---|---|---|---|---|
| White | 0 | 64.2 | 1.6 | 5.2 | 0 |
| White | 4.5 | 63.3 | 2.0 | 7.0 | 2.0 |
| White | 9 | 60.6 | 2.3 | 9.3 | 5.5 |
| Yellow | 0 | 71.9 | 4.4 | 21.9 | 0 |
| Yellow | 4.5 | 72.7 | 5.6 | 26.9 | 5.3 |
| Yellow | 9 | 70.2 | 6.3 | 31.6 | 10.0 |
| Pink | 0 | 68.8 | 9.3 | 14.9 | 0 |
| Pink | 4.5 | 68.5 | 10.7 | 18.3 | 3.7 |
| Pink | 9 | 65.7 | 11.9 | 22.0 | 8.2 |

Figure 3:
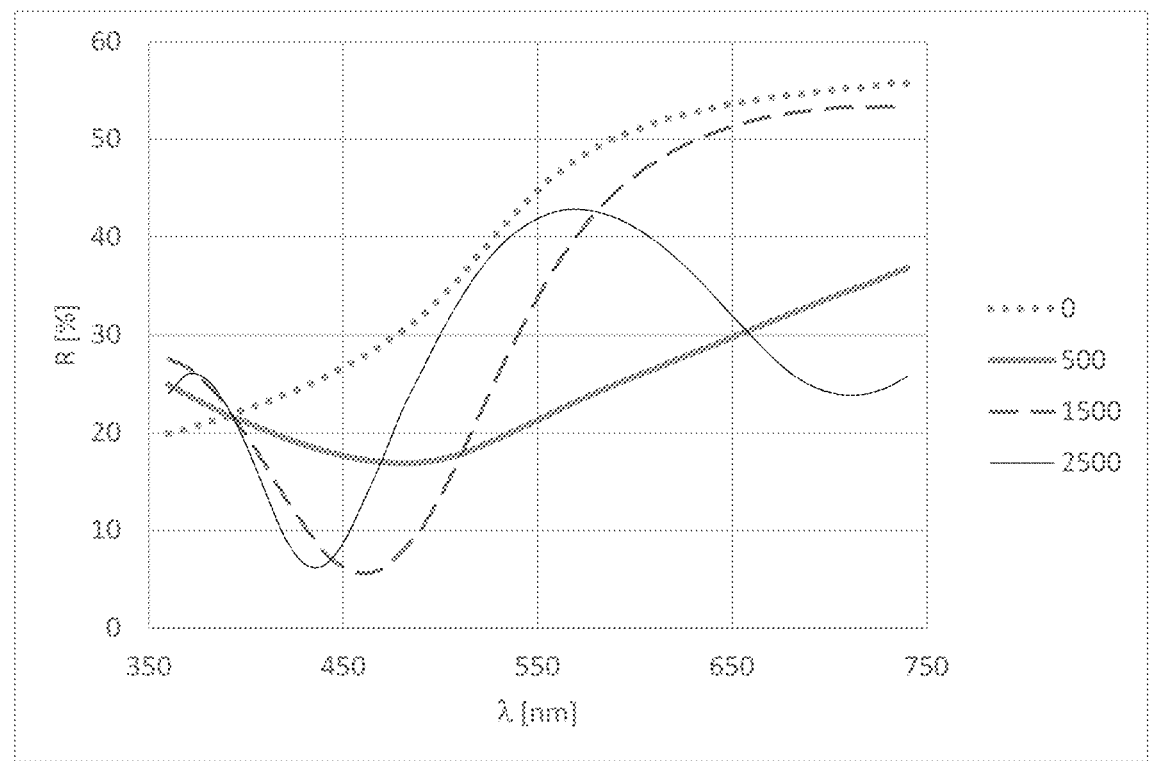
Figure 4:
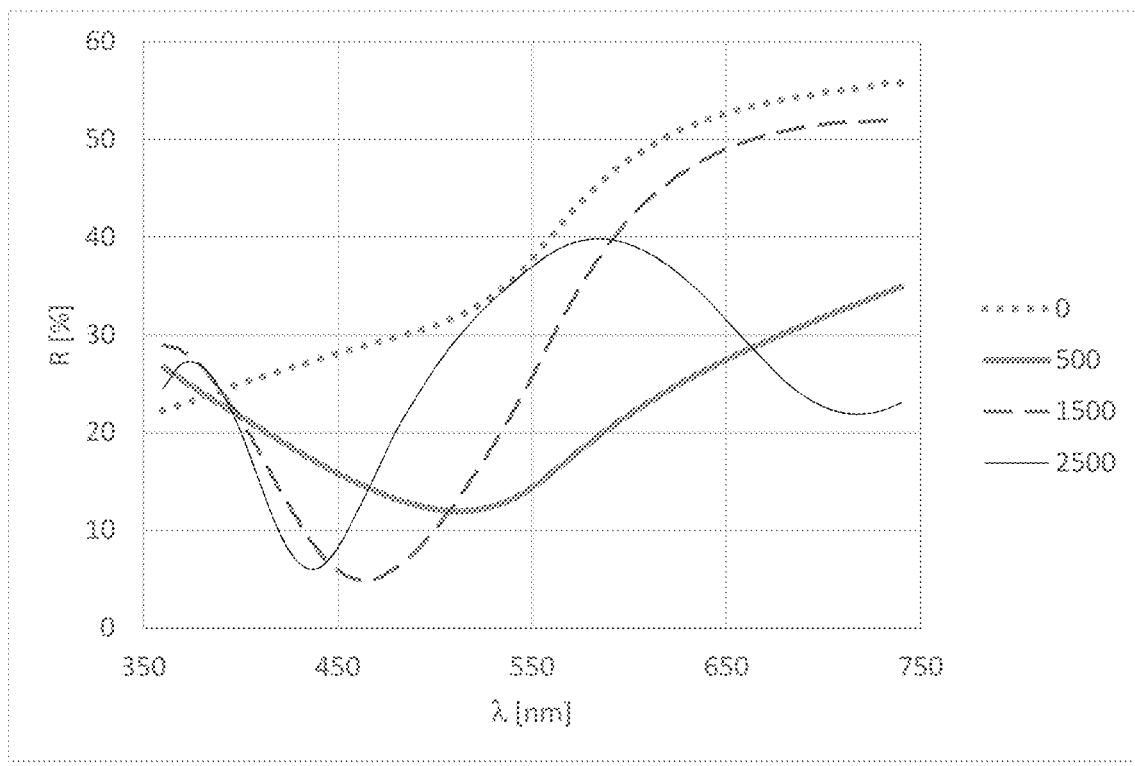

FIGS. 2 to 4 illustrate the same results, representing the reflectances (R in %) as a function of the wavelength ($\lambda$ in nm) measured on a white gold, yellow gold and pink gold substrate respectively, presenting a rough surface finish following sputtering. In each figure, several curves correspond respectively to a substrate considered as reference (0 coating deposition cycle) and on this same substrate coated by 500, 1500 and 2500 cycles of tantalum oxide depositions by the ALD technique (i.e., respective thicknesses of 45 nm, 135 nm and 225 nm).

According to a third example embodiment, the same process is applied, depositing different types of oxides (titanium oxide, aluminum oxide and tantalum oxide, the latter being tested with two thicknesses) on components with different types of transparent gemstones as decorations, of different colors (colorless diamond, green emerald, blue sapphire, red ruby), which are natural in the present case.

Figures 5, 6:
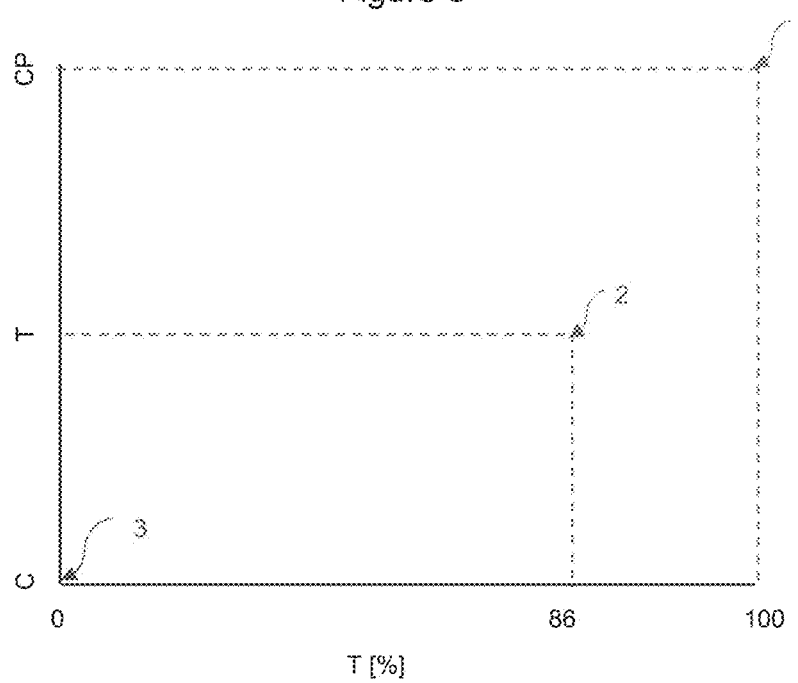
FIG. 5 represents components obtained according to a third example embodiment of the invention.
FIG. 6 illustrates the degree of perception of the coating for a 47 nm tantalum oxide coating deposited by the ALD technique, as a function of the transmittance of the material receiving it according to the third example embodiment of the invention.

FIG. 5 represents photos in a table of results. It appears that for the same geometry of set applique, the results obtained in terms of change in the color of the substrate and the absence of change in the appearance of the gemstones depend on the chemical nature of the deposited coating and its thickness.

The results obtained are also described in Tables 3a and 3b below, in which the observed level of coloring is indicated by the following coding:

C: colors (describes the case where the difference between the color of the substrate before and after the deposition of the coating according to the invention is definable);

CP: does not color (describes the case where the difference between the color of the substrate before and after the deposition of the coating according to the invention is not perceptible);

T: tarnishes (describes the intermediate case where the difference between the appearance of the substrate before and after the deposition of the coating according to the invention is perceptible, but the color is not definable).

TABLE 3a

Aesthetic impact of different coatings on different substrate materials.

| ALD coating vs. substrate material | $Ta_2O_5$ 47 nm | $Ta_2O_5$ 225 nm | $TiO_2$ 48 nm | $Al_2O_3$ 165 nm |
|---|---|---|---|---|
| 18 carat pink gold | C | C | C | C |
| 18 carat yellow gold | C | C | C | C |
| 18 carat white gold | C | C | C | C |
| 24 carat yellow gold | C | C | C | C |
| Palladium | C | C | C | C |
| Silicon | C | C | C | C |

TABLE 3b

Aesthetic impact of different coatings on different decoration materials.

| ALD coating vs. decoration material | $Ta_2O_5$ 47 nm | $Ta_2O_5$ 225 nm | $TiO_2$ 48 nm | $Al_2O_3$ 165 nm |
|---|---|---|---|---|
| Red ruby (3.4 mm × 1.4 mm) | ~T | ~CP | ~CP | ~CP |
| Red ruby (Ø 0.65 mm) | CP | CP | CP | CP |
| Green emerald (Ø 1.80 mm) | CP | CP | CP | CP |
| Blue sapphire (Ø 0.65 mm) | CP | CP | CP | CP |
| Colorless diamond (3.4 mm × 1.4 mm) | CP | CP | CP | CP |
| Colorless diamond (Ø 0.65 mm) | CP | CP | CP | CP |
| Colorless solid alumina (transparent sapphire crystal) (Ø 29 mm) | T | C | T | CP |

The dimensions of the decorations indicated are the maximum dimensions of the visible part of the decoration (diameter or length×width).

The results show that for an opaque substrate, such as metals and metalloids, the coloring by the deposition of a coating is perceptible on all the configurations tested, independently of the size of the substrate, while for a transparent or semi-transparent decoration, the perception of the coloring at an equivalent layer varies according to the size and the initial hue of the decoration. It is noted that semi-transparent elements, such as diamonds and other colored stones, are not perceptibly impacted aesthetically by the coating, i.e., their color is not perceptibly changed, to the extent to they are not large. A change in color is, for example, perceptible on the surface of an alumina watch crystal or on certain relatively large stones.

The preceding results of this third example illustrate that there may be, in certain cases, a limit in transmittance and dimensions to define whether an element will be colored or not by the addition of a thin coating. However, this limit is difficult to define by a simple formula because of the large number of parameters involved, and the particular complex geometry of the components. Generally, the increase in transmittance makes coloring less perceptible. Similarly, the increase of a surface of a component makes coloring more perceptible.

However, FIG. 6 illustrates the degree of perception of the coating for a 47 nm tantalum oxide coating deposited by the ALD technique, as a function of the transmittance of the material, in the case of appliques comprising diamonds 1 having a maximum visible diameter of 1.4 mm, a sapphire crystal 2 with a diameter of 29 mm or a metal alloy substrate 3.

According to a fourth example embodiment, a deposition of a 9.9 nm thick tantalum oxide coating was carried out on a white gold enamel dial. The enamel is transparent, light green, located in recesses made in the dial. The results of the spectrocolorimetric measurements are summarized in Table 4 below. The coating gave a perceptible coloring to the gold and an almost imperceptible coloring to the transparent enamel.

TABLE 4

Results of spectrocolorimetric measurements performed with illuminant D65, in CIE L*a*b* space, in SCE mode, on white gold and enamel, before and after deposition of a 9.9 nm thick $Ta_2O_5$ coating.

| Location of the measurement | L* | a* | b* | ΔE* |
|---|---|---|---|---|
| Green enamel | 32.46 | −39.03 | 8.70 | — |
| Enamel coated with 9.9 nm $Ta_2O_5$ | 34.03 | −36.69 | 8.68 | 2.82 |
| White gold | 54.22 | 1.99 | 7.94 | — |
| White gold coated with 9.9 nm $Ta_2O_5$ | 45.71 | 2.5 | 4.92 | 9.05 |

It appears that the invention can be implemented in a very broad manner, going well beyond the example embodiments described above. Indeed, it ultimately applies to any timepiece or jewelry component comprising a substrate and at least one decoration joined to the substrate, and comprising a coating covering at least one part of the substrate and at least one part of the decoration, the coating changing the perceptible color of the substrate without changing the perceptible color of the at least one decoration.

In all cases, the substrate is any part intended to receive at least one decoration. Preferably, it is composed of a gold alloy, in particular an 18-carat alloy of white gold, pink gold, red gold or yellow gold. Alternatively, it may also be composed of platinum, a platinum-based alloy, copper, a copper-based alloy (brass, nickel silver, bronze in particular), ruthenium, a ruthenium-based alloy, palladium, a palladium-based alloy, nickel, or a nickel-based alloy. More generally, the substrate can be made of metal or of metal alloy or of metalloid.

Alternatively, any opaque material that can be used as a decoration substrate is suitable. The substrate preferably has a transmittance of less than 86%, or even less than or equal to 50%.

Moreover, the substrate can have any shape, flat or not, including a three-dimensional shape. It can comprise a three-dimensional attachment device for the at least one decoration, in particular one or more crimping claws. The device for attaching the at least one decoration may be of any type, as long as it allows the decoration to be joined, secured, attached, or fixed, to the substrate. Thus, the at least one decoration can be joined to the substrate by crimping or by partitioning.

Similarly, the at least one decoration can be in a multiple form. It is at least partially transparent. More precisely, according to an embodiment, its transmittance is greater than or equal to 86%, or even greater than or equal to 90%. By way of remark, the decoration can be completely transparent (or of high transmittance), or alternatively transparent in certain areas only (comprising for example opaque inclusions in certain areas).

The decoration also advantageously has a small size. In particular, it advantageously has a maximum surface area projected onto a plane of less than or equal to 8 cm², or even less than or equal to 1 cm², or even less than or equal to 0.5 cm².

The at least one decoration may comprise one or more gems set in relief on the substrate and each having a maximum projected surface area of less than or equal to 18 mm², or less than or equal to 15 mm², or less than or equal to 10 mm².

By way of example, the at least one decoration may be a gem, natural or synthetic, such as a gemstone, a diamond, a sapphire, a ruby, or an emerald, or may be a fine stone such as tsavorite, or may be an ornamental stone.

Alternatively, the at least one decoration may consist of an enamel-containing area, having a maximum projected surface area of less than or equal to 8 cm². The decoration can thus be made of a transparent material such as enamel, glass-ceramic or glass.

Naturally, the timepiece or jewelry component may comprise a single decoration or several decorations joined to the same substrate, even possibly so as to cover almost the entire surface of the substrate. By way of example, the timepiece component may consist of a dial entirely set with diamonds. Alternatively, the timepiece component may consist of a cloisonné enameled dial.

As previously explained, the coating is chosen to bring a predefined color to the substrate, while not changing the appearance of at least one decoration, preferably all the decorations. As seen previously, a number of parameters must be taken into account for the choice of the coating. Among these parameters, some are related to the coating itself, in particular its composition and thickness. Other parameters are related to the component's substrate, in particular its material, its surface finish and its opacity. Finally, other parameters are related to the decoration of the component, in particular its material, its transmittance, its shape and its size. The person skilled in the art will know how to choose the coating that will enable him or her to achieve the desired aesthetic effect by applying the process according to the invention.

Preferably, the coating is a metal oxide, in particular tantalum oxide such as tantalum oxide of stoichiometry Ta$_2$O$_5$, or a titanium oxide, or a silicon oxide, or an aluminum oxide, or a metal alloy oxide, or a nitride, or an oxynitride.

Moreover, the coating is transparent. In all cases, it is noted that a very thin coating layer meets the desired objective. Thus, the coating preferably has a thickness less than or equal to 100 nm, or even less than or equal to 165 mm, or even less than or equal to 200 nm, or even less than or equal to 225 nm. On the other hand, this thickness must have a minimum value sufficient to color a substrate. Preferably, this thickness is greater than or equal to 4 nm.

To achieve this objective, several deposition techniques are possible. For example, the coating can be deposited by a physical vapor deposition (PVD) method, or by a chemical vapor deposition (CVD) method, or by an atomic layer deposition (ALD) method, or by a sol-gel process, or by a pulsed layer deposition (PLD) method or by self-assembled monolayers (SAM).

Preferably, the coating is deposited uniformly and homogeneously, at constant thickness, on the at least one part of the substrate and the at least one part of the decoration. It preferably also conforms to the at least one part of the substrate and the at least one part of the decoration, i.e., it covers all the surfaces of the substrate and of the decoration(s) of the component, while respecting the possibly complex three-dimensional geometry and the surface finishes of the component.

The ALD deposition technique will generally be preferred because it has several advantages relative to other techniques, including the possibility of guaranteeing the above-mentioned conformity of the coating, even for a component with a possibly complex three-dimensional shape, in particular since it is not directional, and including the possibility of achieving a wide range of possible thicknesses, particularly very small ones, the extremely vast chemical nature of the possible coatings also making the range of achievable colors very wide.

As explained before, the change in color by the coating is considered perceptible if the coefficient $\Delta E^*$ is greater than 1, or even greater than 2, or even greater than 3, or even greater than 4, and more generally if the coefficient $\Delta E^*$ is greater than a threshold comprised between 1 and 3 inclusive, or between 1 and 4 inclusive. It is considered that there is no change in the perceptible color of the decoration if the color deviation defined by the coefficient $\Delta E^*$ is less than 1. On large surfaces, this color change can be measured to obtain the aforementioned value $\Delta E^*$. In a simplified alternative and in particular for small surfaces, it can be determined by the naked eye by an observer. The visual perception of the color change is evaluated with the naked eye, under illuminant D65 lighting conditions and at 30 cm distance.

The invention relates to a timepiece or jewelry component obtained by the manufacturing process described above. It also relates to a timepiece, such as a wristwatch, or a piece of jewelry, comprising such a timepiece or jewelry component.

The timepiece component can be an applique, a dial, a hand, a movement component or a bezel. The invention can be implemented in an extended manner to any other component, consisting of at least two parts, the chemical nature of which differs so that the rendering of the deposited coating can be selective. For example, a dial, a hand or a movement component can be associated with one or more gemstones. Thus, the component can in particular be a movement component made of a nickel phosphorus NiP alloy integral with a synthetic ruby or a movement blank made of brass integral with one or more synthetic rubies.

Moreover, said two parts of the component are made integral by any method known to the skilled person, by any attachment device. The decorations are preferably crimped by an operation involving the deformation of the substrate material. Alternatively, the two parts can be inlaid, cast one into the other.

As previously mentioned, the invention also relates to a process for manufacturing a timepiece or jewelry component, comprising the following steps:
Obtaining a substrate;
Joining at least one decoration to said substrate to form a component;
And comprising a further step consisting in depositing a coating on all or part of the substrate and all or part of the at least one decoration, such that the coating changes the perceptible color of the substrate without changing the perceptible color of the at least one decoration.

The first step of obtaining a substrate can include the procurement of the different parts of the component: the substrate and the decoration(s).

The step of joining the at least one decoration may include a step of crimping the decoration, comprising the deformation of part of the substrate, for example claws, to cooperate with the at least one decoration. Alternatively, this step may comprise an attachment by any substrate attachment device, such as an inlay of the at least one decoration, a casting of the at least one decoration into the substrate, a gluing, etc. Alternatively still, this step may comprise sintering a vitreous enamel on the surface of the substrate or in a cavity made in the substrate beforehand.

The step of depositing a coating on all or part of the substrate and on all or part of the at least one decoration advantageously comprises the implementation of an ALD technique, or alternatively a physical vapor deposition (PVD) method, or a chemical vapor deposition (CVD) method, or an atomic layer deposition (ALD) method, or a pulsed layer deposition (PLD) method, or by a sol-gel process, or by self-assembled monolayers (SAM).

By way of remark, the coating deposition step is performed without masking any part of the component, in particular without masking the decoration(s), which makes the process easy to implement and guarantees the final quality of the coating, since no subsequent steps—such as would be the case if the decoration were attached to the substrate after the deposition of the coating—are likely to damage it. The masking of certain areas of the component for technical or aesthetic reasons remains possible.

The first step consisting in obtaining a substrate may consist in obtaining a substrate made of metal or of metal alloy or of metalloid or of opaque material, in particular an alloy of white gold, pink gold, red gold or yellow gold, or platinum or a platinum-based alloy, or copper or a copper-based alloy, ruthenium, or a ruthenium-based alloy, or palladium, or a palladium-based alloy, or nickel, or a nickel-based alloy.

The first step consisting in obtaining a substrate may consist in obtaining a substrate having a transmittance of less than 86%, or even less than or equal to 50%. It may also consist in obtaining a substrate having a three-dimensional shape, in particular comprising a three-dimensional attachment device for the at least one decoration, in particular comprising one or more crimping claws.

The second step consisting in joining at least one decoration may consist in joining at least one transparent decoration, in particular which has a transmittance greater than or equal to 86%, or even greater than or equal to 90%.

This step can consist in joining at least one decoration which has a maximum surface area projected onto a plane of less than or equal to 8 cm², or even less than or equal to 1 cm², or even less than or equal to 0.5 cm², or even less than or equal to 18 mm², or even less than or equal to 15 mm², or even less than or equal to 10 mm².

This step may consist in joining at least one decoration which is a gem, natural or synthetic, such as a gemstone, a diamond, a sapphire, a ruby, or an emerald, or a fine stone such as a tsavorite or an ornamental stone, or consists of a transparent material such as enamel, glass-ceramic or glass. The at least one decoration may comprise one or more gems set in relief on the substrate and each having a projected surface area of less than or equal to 18 mm². The at least one decoration may consist of one or more enamel-containing areas, each of said areas having a maximum projected surface area of less than or equal to 8 cm².

The step of depositing a coating on all or part of the substrate and on all or part of the at least one decoration may consist in depositing a coating which has a thickness greater than or equal to 4 nm, and/or a thickness less than or equal to 100 nm, or even less than or equal to 165 mm, or even less than or equal to 200 nm, or even less than or equal to 225 nm.

The step of depositing a coating on all or part of the substrate and on all or part of the at least one decoration may consist in depositing a coating which is a metal oxide, in particular tantalum oxide such as tantalum oxide of stoichiometry $Ta_2O_5$, or a titanium oxide, or a silicon oxide, or an aluminum oxide, or a metal alloy oxide, or a rare-earth oxide, or a nitride, or an oxynitride, or a carbide and/or in that the coating is transparent The step of depositing a coating on all or part of the substrate and on all or part of the at least one decoration may consist of a uniform and homogeneous deposition, at constant thickness, on the at least one part of the substrate and the at least one part of the decoration, and conforming to the at least one part of the substrate and the at least one part of the decoration.

The step of depositing a coating on all or part of the substrate and on all or part of the at least one decoration may consist in depositing it on at least one part of the substrate participating in the attachment of the at least one decoration.

Finally, the process can be used to manufacture an applique, a dial, a hand, a movement component, or a bezel.

The invention claimed is:

1. A timepiece or jewelry component comprising:
   a substrate having a perceptible color, wherein the substrate is made of a material selected from the group consisting of metal, metal alloy, metalloid, and opaque material, wherein the substrate has a transmittance of less than 86%,
   at least one decoration joined to the substrate, the at least one decoration having a perceptible color, wherein the at least one decoration is transparent, wherein the at least one decoration has a transmittance greater than or equal to 86%, and
   a coating, which is a transparent coating covering at least one part of the substrate and at least one part of the decoration, wherein the coating is made of a material selected from the group consisting of metal oxide, carbide, nitride, and oxynitride,
   wherein the transparent coating changes the perceptible color of the substrate without changing the perceptible color of the at least one decoration.

2. The timepiece or jewelry component as claimed in claim 1, wherein the coating changes the perceptible color of the substrate according to a color difference defined by a coefficient $\Delta E^*$ greater than 1, without changing the perceptible color of the decoration according to a color difference defined by a coefficient $\Delta E^*$ less than 1.

3. The timepiece or jewelry component as claimed in claim 1, wherein the coating makes a change to the perceptible color of the substrate so that the change is perceptible to the naked eye by an observer, under illuminant D65 lighting conditions and at 30 cm distance, and wherein a change in the color of the decoration is not perceptible by an observer under illuminant D65 lighting conditions and at 30 cm distance.

4. The timepiece or jewelry component as claimed in claim 1, wherein the substrate has a three-dimensional shape, comprising a three-dimensional attachment device for the at least one decoration.

5. The timepiece or jewelry component as claimed in claim 4, wherein the three-dimensional attachment device for the at least one decoration comprises one or more crimping claws.

6. The timepiece or jewelry component as claimed in claim 1,
   wherein the at least one decoration has a maximum surface area projected onto a plane of less than or equal to 8 cm², or
   wherein the at least one decoration comprises one or more gems set in relief on the substrate and each having a projected surface area less than or equal to 18 mm².

7. The timepiece or jewelry component as claimed in claim 1,
   wherein the at least one decoration is a natural or synthetic gem.

8. The timepiece or jewelry component as claimed in claim 1,
   wherein the at least one decoration is constituted by one or more enamel-containing areas, each of said areas having a maximum projected surface area less than or equal to 8 cm².

9. The timepiece or jewelry component as claimed in claim 1,
   wherein the coating is a coating deposited by a physical vapor deposition (PVD) method, or by a chemical vapor deposition (CVD) method, or by an atomic layer deposition (ALD) method, or by a pulsed laser deposition (PLD) method, or by a sol-gel process, or by self-assembled monolayers (SAM).

10. The timepiece or jewelry component as claimed in claim 1, wherein the coating has a thickness in a range of from 4 nm to 225 nm.

11. The timepiece or jewelry component as claimed in claim 1, wherein the coating is a metal oxide.

12. The timepiece or jewelry component as claimed in claim 1, wherein the coating is deposited uniformly and homogeneously, at constant thickness, on the at least one part of the substrate and the at least one part of the decoration, and conforms to the at least one part of the substrate and the at least one part of the decoration.

13. The timepiece or jewelry component as claimed in claim 1,
   wherein the at least one decoration is joined to the substrate by crimping or by partitioning and wherein the coating is deposited at least partially on the part of the substrate participating in the attachment of the decoration.

14. The timepiece or jewelry component as claimed in claim 1,
which is an applique, a dial, a hand, a movement component, or a bezel.

15. A timepiece or jewelry piece, comprising at least one timepiece or jewelry component as claimed in claim 1.

16. The timepiece or jewelry component as claimed in claim 1, wherein the material of the coating is a metal oxide selected from the group consisting of tantalum oxide, titanium oxide, silicon oxide, aluminum oxide, metal alloy oxide, and rare earth oxide.

17. The timepiece or jewelry component as claimed in claim 1, wherein the coating has a thickness in a range of from 4 to 100 nm.

18. The timepiece or jewelry component as claimed in claim 1, wherein the material of the substrate is selected from the group consisting of gold, gold alloy, platinum, ruthenium, ruthenium alloy, palladium, palladium alloy, nickel, nickel alloy, copper, copper alloy.

19. The timepiece or jewelry component as claimed in claim 1, wherein the material of the substrate is a gold alloy selected from the group consisting of white gold alloy, grey gold alloy, rose gold alloy, red gold alloy, and yellow gold alloy.

20. A process for manufacturing a timepiece or jewelry component, comprising:

providing a substrate having a perceptible color, wherein the substrate is made of a material selected from the group consisting of metal, metal alloy, metalloid, and opaque material, wherein the substrate has a transmittance of less than 86%;

joining at least one decoration to the substrate to form a component, the at least one decoration having a perceptible color, wherein the at least one decoration is transparent, wherein the at least one decoration has a transmittance greater than or equal to 86%; and depositing a transparentcoating on at least one part of the substrate and on at least one part of the decoration, wherein the coating is a transparent coating made of a material selected from the group consisting of metal oxide, carbide, nitride, and oxynitride, so that the coating changes the perceptible color of the substrate without changing the perceptible color of the at least one decoration.

* * * * *